(12) United States Patent
Ito et al.

(10) Patent No.: US 12,345,738 B2
(45) Date of Patent: Jul. 1, 2025

(54) PROBE HOLDER AND PROBE UNIT

(71) Applicant: NHK Spring Co., Ltd., Yokohama (JP)

(72) Inventors: Osamu Ito, Kanagawa (JP); Kazuya Soma, Kanagawa (JP); Hajime Arai, Kanagawa (JP)

(73) Assignee: NHK Spring Co., Ltd., Yokohama (JP)

( * ) Notice: Subject to any disclaimer, the term of this patent is extended or adjusted under 35 U.S.C. 154(b) by 179 days.

(21) Appl. No.: 18/352,291

(22) Filed: Jul. 14, 2023

(65) Prior Publication Data

US 2024/0019460 A1  Jan. 18, 2024

(30) Foreign Application Priority Data

Jul. 15, 2022 (JP) .................................. 2022-113933

(51) Int. Cl.
*G01R 1/04* (2006.01)
*G01R 1/073* (2006.01)
*G01R 1/067* (2006.01)

(52) U.S. Cl.
CPC .......... *G01R 1/045* (2013.01); *G01R 1/07335* (2013.01); *G01R 1/06772* (2013.01)

(58) Field of Classification Search
CPC ............... G01R 1/045; G01R 1/07335; G01R 1/06772; G01R 1/06722; G01R 1/07314;
(Continued)

(56) References Cited

U.S. PATENT DOCUMENTS 6,642,728 B1   11/2003   Kudo et al.
11,782,074 B2  10/2023   Inuma et al.
(Continued)

FOREIGN PATENT DOCUMENTS

JP   2018-036129 A    3/2018
JP   2021-169931 A   10/2021
(Continued)

OTHER PUBLICATIONS

Office Action dated Jan. 25, 2024, issued in the corresponding TW patent application No. 112125612 and English translation thereof.
(Continued)

*Primary Examiner* — G. M. A Hyder
(74) *Attorney, Agent, or Firm* — Troutman Pepper Locke LLP

(57) ABSTRACT

A probe holder includes: a first layered member including members layered over one another; and a second layered member bonded to the first layered member and including members layered over one another. Each of the first and second layered members includes: a first member made of a material having a low dielectric constant; a second member provided on one of surfaces of the first member and having higher hardness than the first member; and a third member provided on the other surface of the first member and having higher hardness than the first member. The probe holder further includes a holder hole formed by bonding the third members of the first and second layered members, the holder hole penetrating the probe holder in a direction in which the first and second layered members are layered, and having a stepped hole shape having a smaller diameter in the second members.

5 Claims, 7 Drawing Sheets

(58) Field of Classification Search
CPC .. G01R 1/0408; G01R 1/073; G01R 31/2831; G01R 31/2863
See application file for complete search history.

(56) References Cited

U.S. PATENT DOCUMENTS 11,940,465 B2    3/2024   Soma et al.
2021/0190821 A1*  6/2021   Hattis ................. H01R 13/405

FOREIGN PATENT DOCUMENTS

| KR | 10-2001-0070991 A | 7/2001 |
| KR | 10-2021-0123358 A | 10/2021 |
| TW | 202022388 A | 6/2020 |

OTHER PUBLICATIONS

Office Action dated Jan. 6, 2025, issued in the KR patent application No. 10-2023-0086524 and English translation thereof.

* cited by examiner

PROBE HOLDER AND PROBE UNIT

This application is based upon and claims the benefit of priority of the prior Japanese Patent Application No. 2022-113933, filed on Jul. 15, 2022, the entire contents of which are incorporated herein by reference.

BACKGROUND

The present disclosure relates to probe holders and probe units.

In performing an electrical continuity test or an operation characteristic test on a test target, such as a semiconductor integrated circuit or a liquid crystal panel, a probe unit including plural contact probes and a probe holder accommodating the plural contact probes has been used to electrically connect between the test target and a signal processing device that outputs a test signal (see, for example, Japanese Unexamined Patent Application, Publication No. 2018-36129). A known probe holder like the one disclosed in Japanese Unexamined Patent Application, Publication No. 2018-36129 has three plates layered over one another. Each plate has holes formed therein, the holes respectively being capable of accommodating part of the contact probes, and holder holes for accommodating the contact probes are formed by communication between the holes of these plates. These holder holes each has a stepped shape with a smaller diameter at both ends of the holder hole. In the probe unit, causing stepped portions of the holder holes to catch the contact probes prevents the contact probes from coming off the probe holder.

In general, in a case where a high frequency electric signal is input and output, signal loss called insertion loss is generated. For high precision and high speed operation, reducing this insertion loss in a frequency domain used in the probe unit is important. To reduce the insertion loss, the probe holder is formed using a material having a low dielectric constant, for example, polytetrafluoroethylene (PTFE), and the characteristic impedance is thereby adjusted.

In a case where a probe holder is made using PTFE, because PTFE is a comparatively soft material, sandwiching a first plate made of PTFE between two second plates made of a comparatively hard material, for example, polyetheretherketone (PEEK) improves strength of the probe holder.

SUMMARY

Because PTFE is a comparatively soft material, the holder holes may be displaced when the holder holes are formed. Therefore, when the first plate and the second plates are combined to be formed into the probe holder, the positions of the holes may not match between the plates, the frequency characteristics may be degraded, and in particular, loss at high frequency may be increased. If the probe holder is made by forming the holder holes after one of the second plates is combined with the first plate and then combining the other second plate with the combined first and second plates, the accuracy of the positions at which the holes are formed is improved as compared to a case where the probe holder is made of just the first plate, but due to the difference in the materials of the plates, warpage may be caused. This warpage also causes displacement of the holes. When the positions of the holes do not match between the plates, the loss is increased.

There is a need for a probe holder and a probe unit that enable minimization of increase in loss at high frequency.

According to an aspect of the present disclosure, there is provided a probe holder for holding a contact probe that comes into contact respectively, at both ends of a longitudinal length of the contact probe, with target electrodes, the probe holder including: a first layered member including a plurality of members layered over one another; and a second layered member bonded to the first layered member and including a plurality of members layered over one another, wherein each of the first and second layered members includes: a first member made of a material having a low dielectric constant; a second member provided on one of surfaces of the first member and having higher hardness than the first member; and a third member provided on the other surface of the first member and having higher hardness than the first member, and the probe holder further comprises a holder hole formed by bonding the third members of the first and second layered members, the holder hole penetrating the probe holder in a direction in which the first and second layered members are layered over each other, and having a stepped hole shape having a smaller diameter in the second members.

According to another aspect of the present disclosure, there is provided a probe unit including: a contact probe that comes into contact respectively, at both ends of a longitudinal length of the contact probe, with target electrodes; and a probe holder including an insulating main body configured to hold the contact probe, wherein the probe holder includes: a first layered member including a plurality of members layered over one another; and a second layered member bonded to the first layered member and including a plurality of members layered over one another, wherein each of the first and second layered members includes: a first member made of a material having a low dielectric constant; a second member provided on one of surfaces of the first member and having higher hardness than the first member; and a third member provided on the other surface of the first member and having higher hardness than the first member, and the probe holder further comprises a holder hole formed by bonding the third members of the first and second layered members, the holder hole penetrating the probe holder in a direction in which the first and second layered members are layered over each other, and having a stepped hole shape having a smaller diameter in the second members

DETAILED DESCRIPTION

Embodiments will hereinafter be described in detail, together with the drawings. The present disclosure is not limited by the following embodiments. The drawings referred to in the following description just schematically illustrate shapes, sizes, and positional relations to enable the present disclosure to be understood, and the present disclosure is therefore not limited only to the shapes, sizes, and positional relations exemplified by the drawings.

Figure 1:
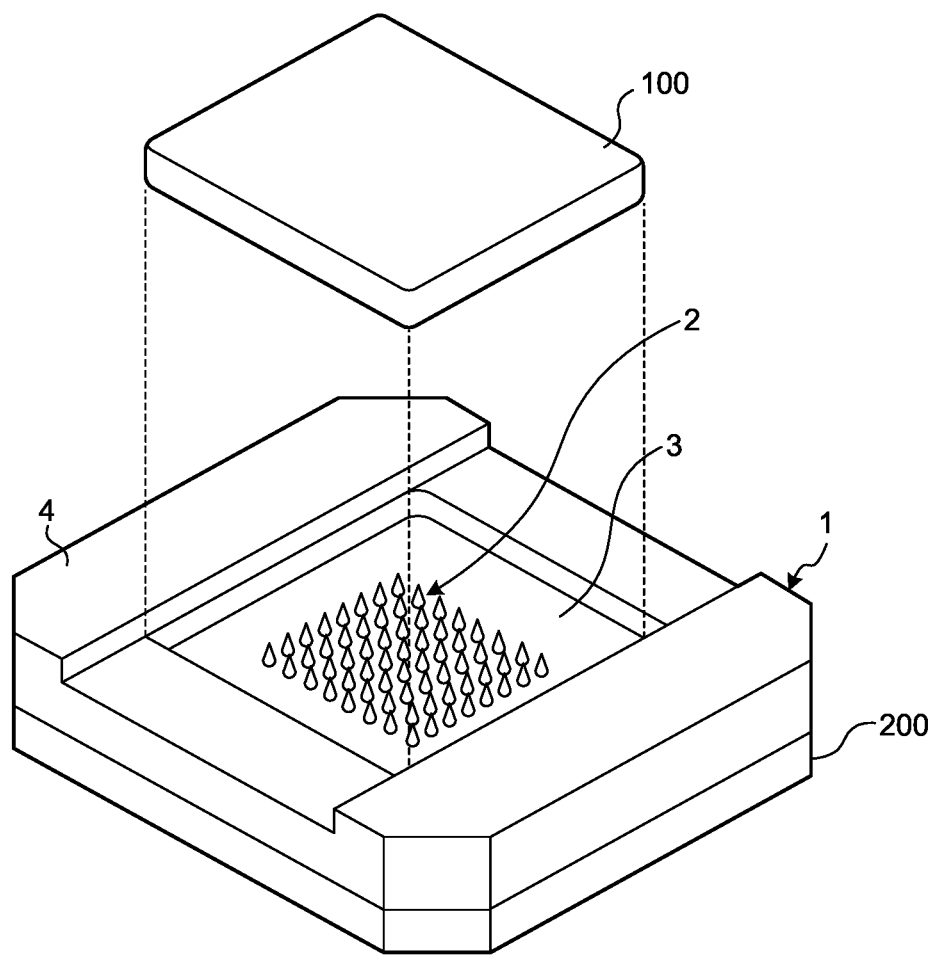
FIG. 1 is a perspective view illustrating a configuration of a probe unit according to a first embodiment.

FIG. 1 is a perspective view illustrating a configuration of a probe unit according to a first embodiment. A probe unit 1 illustrated in FIG. 1 is a device used in testing electrical properties of a semiconductor integrated circuit 100 that is a test target, and is a device that electrically connects between the semiconductor integrated circuit 100 and a circuit board 200 that outputs a test signal to the semiconductor integrated circuit 100.

The probe unit 1 has: electrically conductive contact probes 2 (hereinafter, simply referred to as "probes 2") that come into contact, at both ends of a longitudinal length of the probes 2, with electrodes of the semiconductor integrated circuit 100 and circuit board 200 that are two contacted bodies different from each other; a probe holder 3 that accommodates and holds these plural probes 2 according to a predetermined pattern; and a holder member 4 that is provided around the probe holder 3 and minimizes displacement of the semiconductor integrated circuit 100 that comes into contact with the plural probes 2 upon testing.

Figure 2:
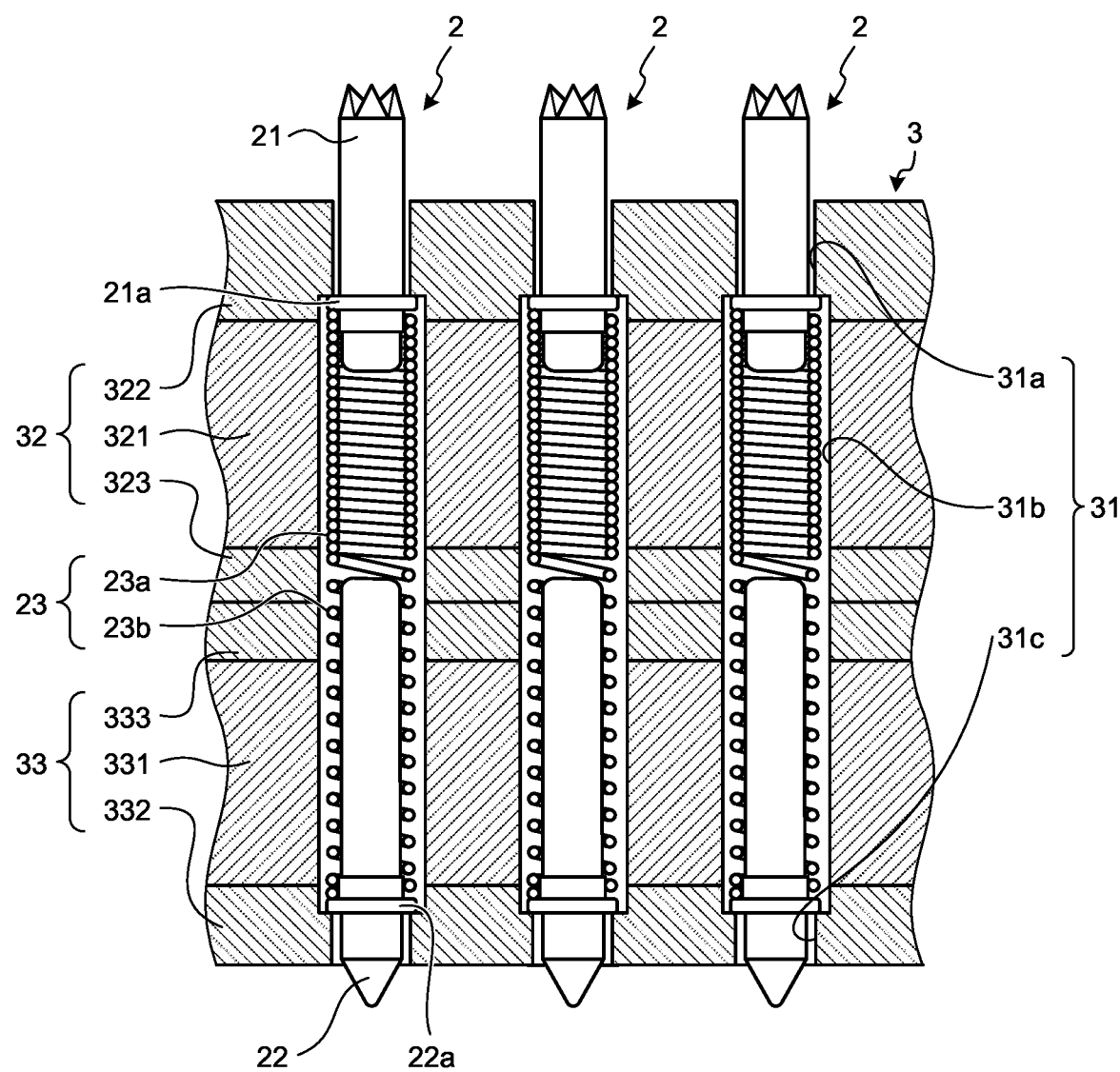
FIG. 2 is a sectional view illustrating a configuration of main parts of the probe unit according to the first embodiment.

FIG. 2 is a sectional view illustrating a configuration of main parts of the probe unit according to the first embodiment. The probes 2 illustrated in FIG. 2 each include: a first plunger 21 that is formed using an electrically conducting material and comes into contact with an electrode of the semiconductor integrated circuit 100 upon testing of the semiconductor integrated circuit 100; a second plunger 22 that comes into contact with an electrode of the circuit board 200 including a test circuit; and a coil spring 23 that is provided between the first plunger 21 and the second plunger 22 and expandably and contractably couples the first plunger 21 and the second plunger 22 to each other. The first plunger 21, the second plunger 22, and the coil spring 23 included in the probe 2 share the same axis. The probe 2 mitigates impact on the electrode of the semiconductor integrated circuit 100 and applies a load to the semiconductor integrated circuit 100 and the circuit board 200 by expansion and contraction of the coil spring 23 in an axial direction when the semiconductor integrated circuit 100 is brought into contact with the probe 2.

The first plunger 21 has a flange portion 21*a* having the largest diameter of the first plunger 21.

The second plunger 22 comes into contact with the electrode formed on the circuit board 200. The second plunger 22 has a flange portion 22*a* having the largest diameter of the second plunger 22. In this first embodiment, the diameter of the flange portion 21*a* and the diameter of the flange portion 22*a* are the same. The diameter of these flange portions corresponds to a length of the probe, the length being in a direction orthogonal to the axis of the probe.

The coil spring 23 has a tightly wound portion 23*a* toward the first plunger 21 and a coarsely wound portion 23*b* around the second plunger 22. An end portion of the tightly wound portion 23*a* is press fitted with the first plunger 21 and abuts against the flange portion 21*a*. An end portion of the coarsely wound portion 23*b* is press fitted with the second plunger 22 and abuts against the flange portion 22*a*. The first plunger 21 and the second plunger 22 are connected to the coil spring 23 by the spring's winding force and/or soldering.

The probe holder 3 has plural holder holes 31 formed therein, the plural holder holes 31 being through holes penetrating the probe holder 3 in a direction in which a first layered member 32 and a second layered member 33 are layered, the plural holder holes 31 being for accommodating the probes 2. Positions at which the holder holes 31 are formed are determined according to an arrangement pattern of the probes 2. FIG. 2 illustrates an example in which central axes of the holder holes 31 coincide with longitudinal axes of the probes 2.

The holder holes 31 are formed as stepped holes each having different diameters along the direction in which the holder holes 31 penetrate the probe holder 3. That is, the holder holes 31 are each formed as a hole having smaller diameters at both ends of the hole, the hole having a first small diameter portion 31*a* with an opening at an upper end surface of the probe holder 3, a large diameter portion 31*b* having a diameter larger than that of the first small diameter portion 31*a*, and a second small diameter portion 31*c* with an opening at a lower end surface of the probe holder 3. The shape (diameters of openings) of these holder holes 31 are determined according to the configuration of the probes 2 accommodated in the holder holes 31. By abutting on a wall surface at a boundary between the first small diameter portion 31*a* and the large diameter portion 31*b*, the flange portion 21*a* of the first plunger 21 has a function of preventing the probe 2 from coming off the probe holder 3. By abutting on a wall surface at a boundary between the large diameter portion 31*b* and the second small diameter portion 31*c*, the flange portion 22*a* of the second plunger 22 has a function of preventing the probe 2 from coming off the probe holder 3.

The probe holder 3 has the first layered member 32 positioned up in FIG. 2 and the second layered member 33 positioned down in FIG. 2, the first layered member 32 and the second layered member 33 having been layered over each other.

The first layered member 32 has a first member 321, a second member 322 positioned above the first member 321, and a third member 323 positioned below the first member 321, as illustrated in FIG. 2, the first member 321, the second member 322, and the third member 323 having been layered over one another.

The second layered member 33 has a first member 331, a second member 332 positioned below the first member 331, and a third member 333 positioned above the first member 331, as illustrated in FIG. 2, the first member 331, the second member 332, and the third member 333 having been layered over one another.

The first members 321 and 331 are formed using a material having a low dielectric constant. The material having a low dielectric constant may be a material having a low relative dielectric constant, for example, a material having a relative dielectric constant of 1.5 to 2.5. Examples of this material include PTFE. An example in which the first members 321 and 331 are formed using PTFE will be described for this first embodiment.

By contrast, the second members 322 and 332 and third members 223 and 333 are formed using a material harder than the material forming the first members 321 and 331.

Examples of this material include: high performance engineering plastic, such as PEEK; polyimide; polyamide; and PPS. An example in which the second members 322 and 332 and the third members 223 and 333 are formed using PEEK will be described for this first embodiment.

That is, each of the first and second layered members 32 and 33 is configured to have PTFE low in dielectric constant sandwiched between hard PEEK members.

The third member 323 of the first layered member 32 and the third member 333 of the second layered member 33 are connected to each other and thereby form the probe holder 3.

Figure 3:
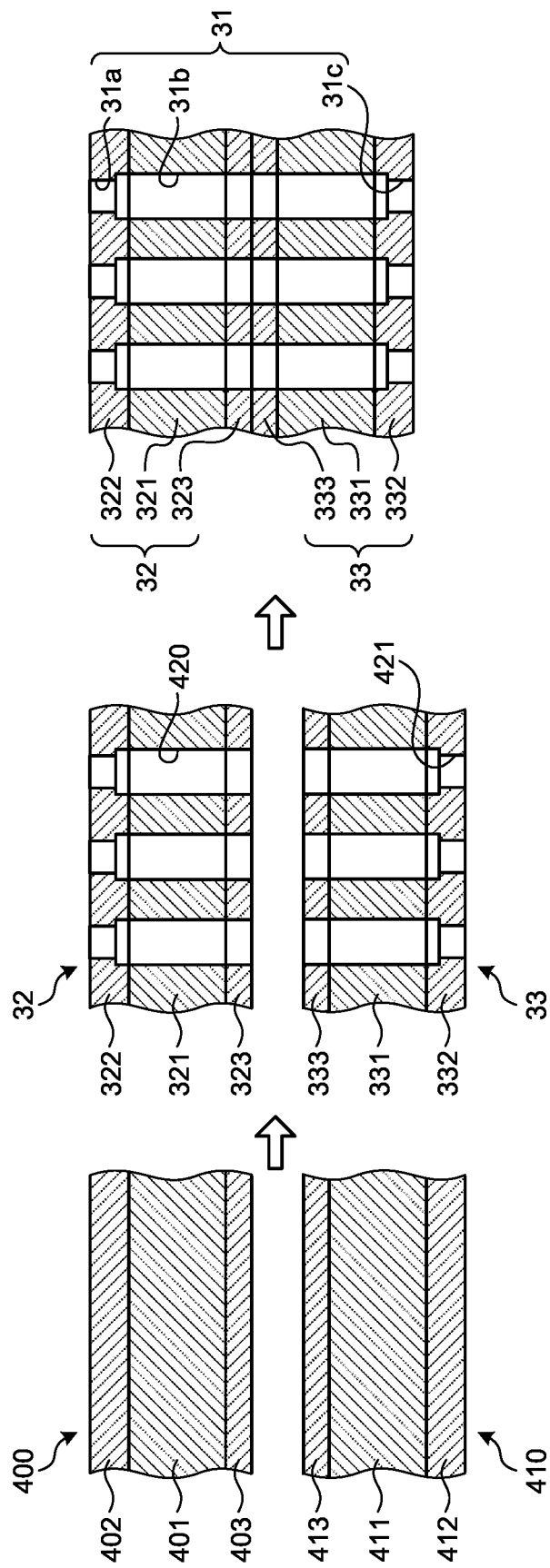
FIG. 3(a), FIG. 3(b) and FIG. 3(c) are sectional views for explanation of a method of manufacturing the probe holder according to the first embodiment.

A method of manufacturing the probe holder 3 will now be described by reference to FIG. 3(a), FIG. 3(b) and FIG. 3(c). FIG. 3(a), FIG. 3(b) and FIG. 3(c) are sectional views for explanation of a method of manufacturing a probe holder according to the first embodiment.

Firstly, a first layered base material 400 and a second layered base material 410 are prepared (see FIG. 3(a)).

The first layered base material 400 is formed by sandwiching a first base material 401 between a second base material 402 and a third base material 403 that are made of hard PEEK and bonding these first to third base materials 401 to 403 together, the first base material 401 being plate shaped and made of PTFE having a low dielectric constant.

The second layered base material 410 is formed by sandwiching a first base material 411 between a second base material 412 and a third base material 413 that are made of hard PEEK and bonding these first to third base materials 411 to 413 together, the first base material 411 being plate shaped and made of PTFE having a low dielectric constant.

A publicly known bonding method using an adhesive or a pressure bonding sheet may be used for the bonding between these base materials.

Thereafter, through holes are formed in the layered base materials (see FIG. 3(b)). Specifically, through holes 420 are formed in the first layered base material 400. These through holes 420 are each formed as a stepped hole having a portion with a smaller diameter, the portion being in the second base material 402. Furthermore, through holes 421 are formed in the second layered base material 410. These through holes 421 are each formed as a stepped hole having a portion with a smaller diameter, the portion being in the second base material 412. Forming these through holes forms the first layered member 32 having the through holes 420 formed therein and the second layered member 33 having the through holes 421 formed therein.

After the through holes have been formed, the first layered member 32 and the second layered member 33 are bonded to each other (see FIG. 3(c)). The probe holder 3 is made by bonding the third member 323 of the first layered member 32 and the third member 333 of the second layered member 33 to each other, with the positions of their through holes aligned with each other.

In manufacturing a probe unit, the probes 2 are installed in the through holes as appropriate before the first layered member 32 and the second layered member 33 are bonded to each other.

Figure 4:
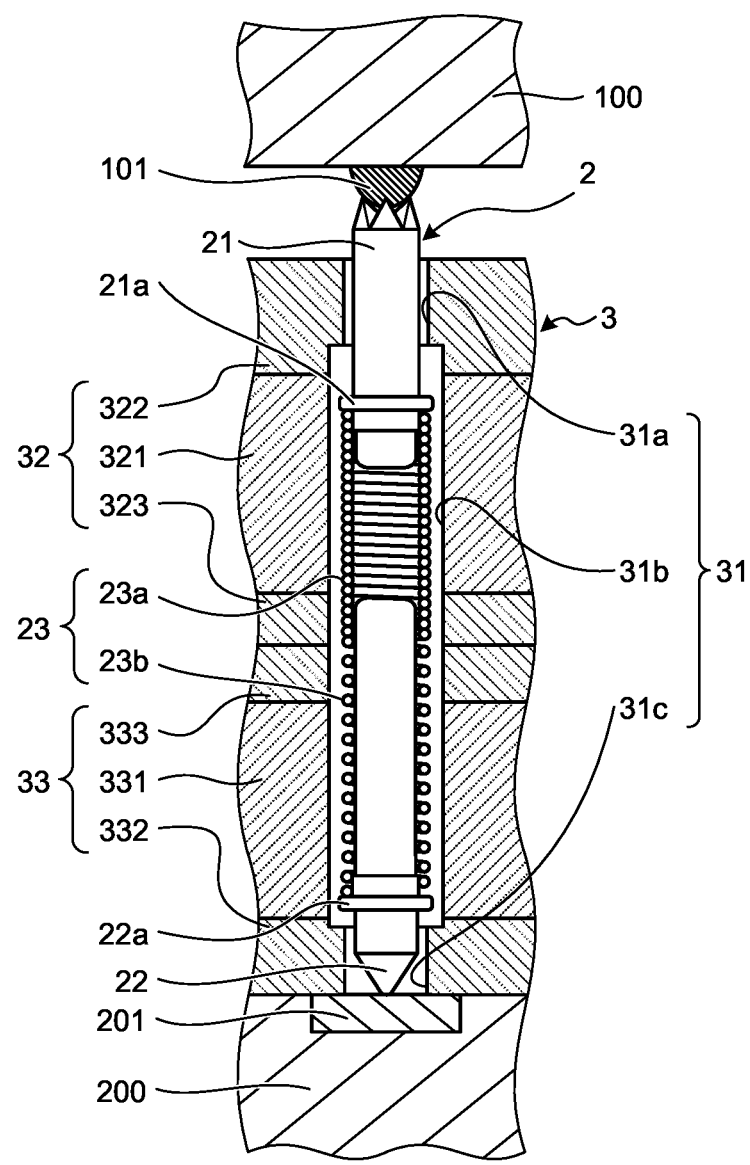
FIG. 4 is a plan view illustrating a configuration of main parts of the probe unit according to the first embodiment.

FIG. 4 is a diagram illustrating a state of the semiconductor integrated circuit 100 in a test using the probe holder 3. When the semiconductor integrated circuit 100 is tested, the coil spring 23 is brought into a state of being compressed in a longitudinal direction thereof by a contact load from the semiconductor integrated circuit 100. When the coil spring 23 is compressed, as illustrated in FIG. 4, the tightly wound portion 23a comes into contact with a proximal end portion of the second plunger 22. Electric continuity is thereby achieved infallibly. In this state, the proximal end portion of the second plunger 22 has advanced to a lower portion of the tightly wound portion 23a, and the axis of the second plunger 22 is thus prevented from moving largely.

A test signal supplied from the circuit board 200 to the semiconductor integrated circuit 100 in a test reaches a connection electrode 101 of the semiconductor integrated circuit 100 from an electrode 201 of the circuit board 200, via the second plunger 22, the tightly wound portion 23a, and the first plunger 21, of the probe 2. In the probe 2, since continuity is thus achieved between the first plunger 21 and the second plunger 22 via the tightly wound portion 23a, length of the conduction path of the electric signal is able to be minimized. Therefore, the signal is prevented from flowing through the coarsely wound portion 23b in the test and the inductance is able to be stabilized.

The probe holder 3 according to the first embodiment described above and having the holder holes 31 formed therein has a two layer structure having the first layered member 32 and the second layered member 33 bonded to each other, the first layered member 32 having the first member 321 sandwiched between the second member 322 and third member 323 that are made of PEEK, the first member 321 being made of PTFE, the second layered member 33 having the first member 331 sandwiched between the second member 332 and third member 333 that are made of PEEK, the first member 331 being made of PTFE. Because each PTFE member is sandwiched between PEEK members in this structure, warpage in formation of holes in the layered members is minimized and thus reduction in accuracy of positions at which the holes are formed is minimized. Preventing warpage and forming the holes at the appropriate positions in the members enable minimization of deterioration of frequency characteristics, and in particular, enable minimization of increase in loss at high frequency.

Furthermore, in the first embodiment, using PTFE to form members composing the probe holder 3 enables adjustment of the characteristic impedance and including PEEK enables strength of the probe holder 3 to be obtained. To improve the high frequency characteristics, the proportion of PEEK may be lowered, and to improve the strength, the proportion of PEEK may be raised.

Furthermore, the first embodiment enables the balance of strength in the layering direction to be improved because PEEK is the intermediate layer of the layered members in the probe holder 3.

Figure 5:
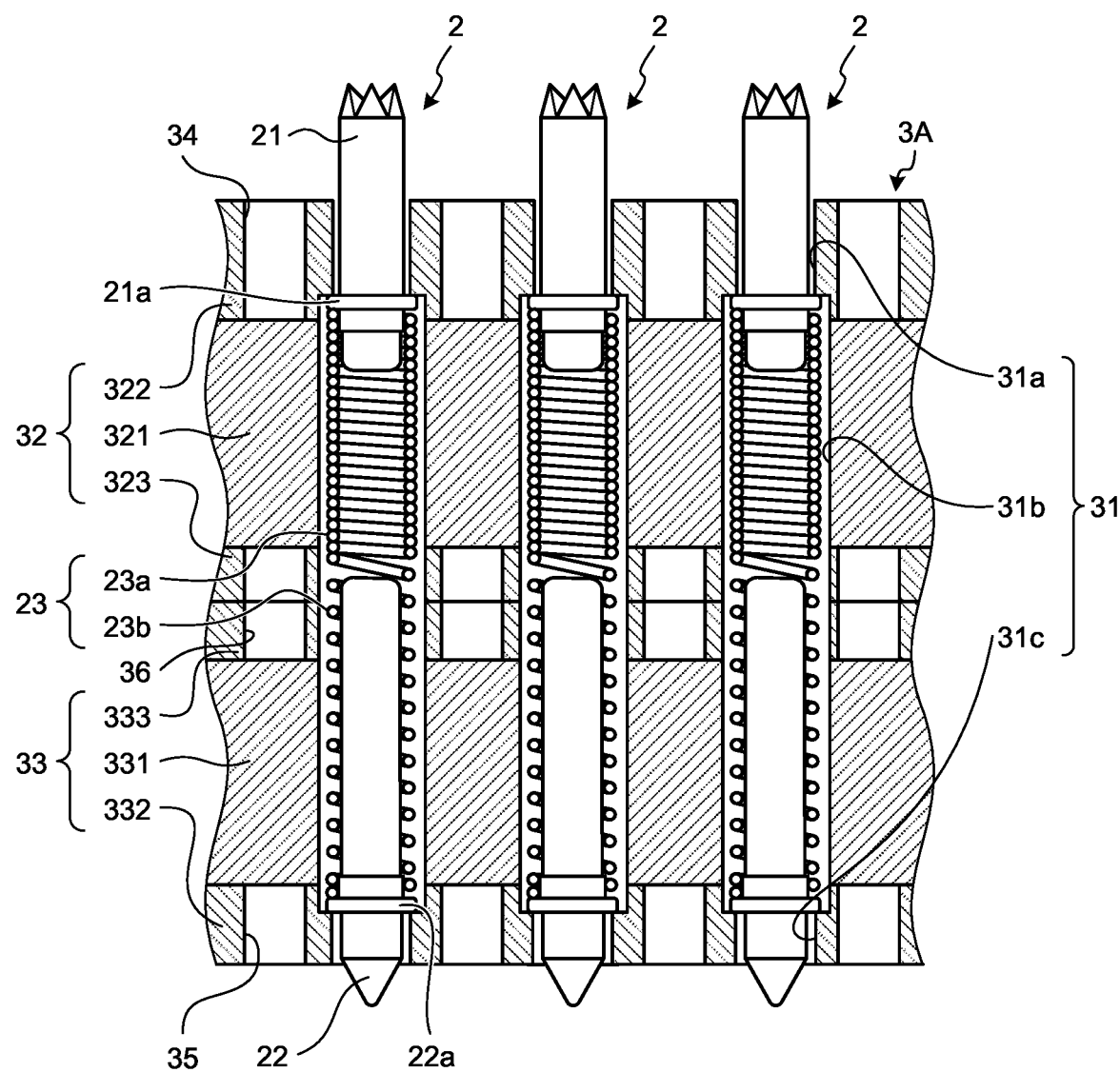
FIG. 5 is a sectional view illustrating a configuration of main parts of a probe unit according to a second embodiment.

A second embodiment will be described next. FIG. 5 is a sectional view illustrating a configuration of main parts of a probe unit according to the second embodiment. The probe unit according to the second embodiment includes a probe holder 3A instead of the probe holder 3 of the probe unit 1 described above. Components other than the probe holder 3A are similar to those of the first embodiment and description thereof will thus be omitted.

The probe holder 3A includes the first layered member 32 and the second layered member 33 that are described above. The probe holder 3A has, formed therein, the holder holes 31 described above, and first counterbore portions 34 to third counterbore portions 36.

The first counterbore portions 34 are formed in the second member 322. The first counterbore portions 34 are each shaped as a bottomed hole formed of a hole penetrating the second member 322 and an outer surface of the first member 321, the bottomed hole having a bottom surface at the surface of the first member 321.

The second counterbore portions 35 are formed in the second member 322. The second counterbore portions 35 are each shaped as a bottomed hole formed of a hole penetrating the second member 332 and an outer surface of the first member 331.

The third counterbore portions 36 are formed in intermediate layers of the probe holder 3A. Holes of the third counterbore portions 36 form spaces closed by outer surfaces of the first members 321 and 331, the holes respectively penetrating the third members 323 and 333.

Figure 6:
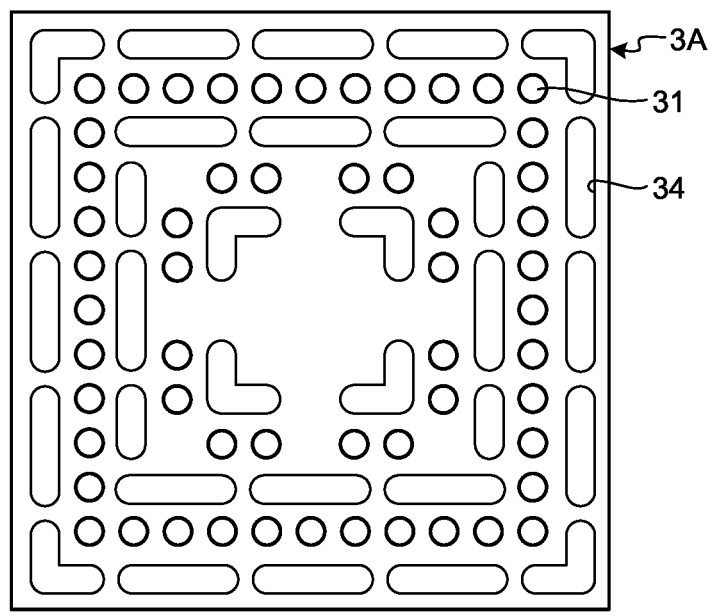
FIG. 6 is a plan view illustrating a configuration of a probe holder included in the probe unit according to the second embodiment.
Figure 7:
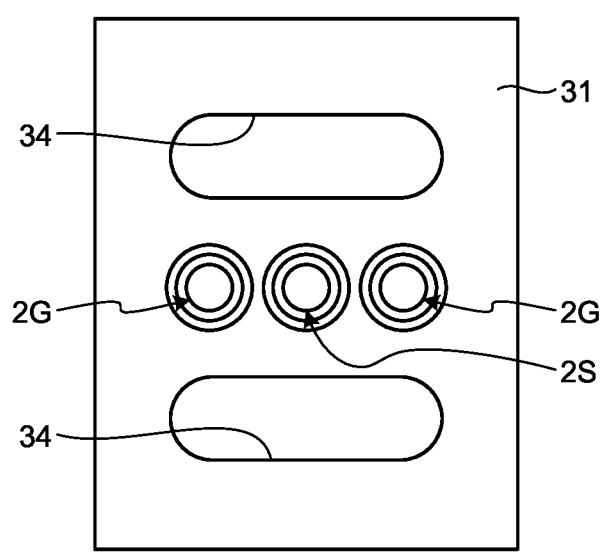
FIG. 7 is a plan view illustrating a configuration of main parts of the probe unit according to the second embodiment.

FIG. 6 is a plan view illustrating a configuration of a probe holder included in the probe unit according to the second embodiment. FIG. 7 is a plan view illustrating a configuration of main parts of the probe unit according to the second embodiment. FIG. 6 and FIG. 7 correspond to a view from above the probe holder illustrated in FIG. 5. In an example considered herein, one of three probes 2 arranged adjacent to each other, the one being in the center, is brought into contact with an electrode for signal transmission, and the other two probes 2 are connected to an electrode for grounding. In this example, the probe 2 connected to the electrode for the signal is referred to as a probe 2S and the probes 2 connected to the electrode for grounding are referred to as probes 2G. Counterbore portions (only the first counterbore portions 34 are illustrated in the figures) are formed around these probes 2S and 2G.

The second embodiment described above achieves the effects of the first embodiment and additionally enables further reduction of the insertion loss at higher frequency by provision of the counterbore portions around the probes 2 in the probe holder 3A. The second embodiment enables further minimization of damping of high frequency signals by formation of the counterbore portions.

Modified Example of Second Embodiment

Figure 8:
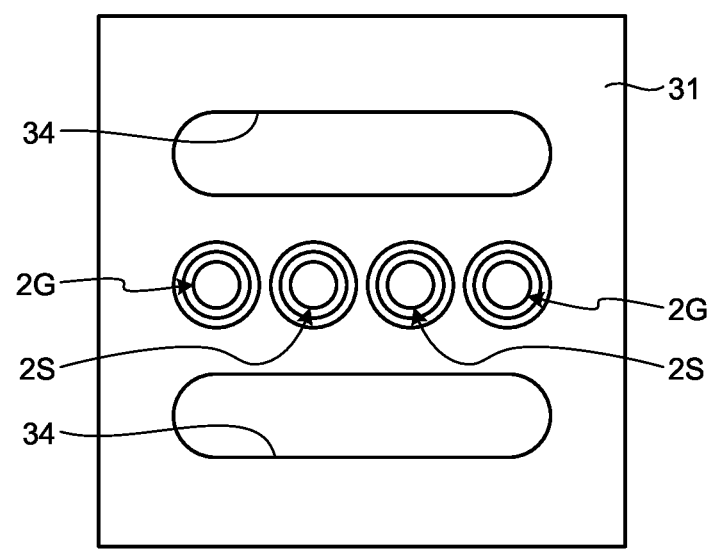
FIG. 8 is a plan view illustrating a configuration of main parts of a probe unit according to a modified example of the second embodiment.

A modified example of the second embodiment will be described next by reference to FIG. 8. FIG. 8 is a plan view illustrating a configuration of main parts of a probe unit according to the modified example of the second embodiment. FIG. 8 corresponds to a view from above the probe holder illustrated in FIG. 5. In this modified example, two of four probes 2 arranged adjacent to each other are probes 2S for signal transmission, the two being in the center, and the other two of the four probes 2 are probes 2G for grounding, the other two being on both sides of the probes 2S. Counterbore portions (only the first counterbore portions 34 are illustrated in FIG. 8) are formed around these probes 2S and 2G. For this GSSG structure also, providing the counterbore portions around the probes 2 enables reduction in insertion loss at higher frequency.

An example in which counterbore portions are formed in members (second and third members) made of PEEK has been described for the second embodiment and the modified example thereof, but counterbore portions may be formed in part of the second and third members, or counterbore portions may be formed in the first member made of PTFE. The counterbore portions formed in the first member in that case may be through holes, or may each be shaped as a hole forming a space closed at one end or both ends of the space.

An example in which the shape of the openings of the counterbore portions is oval has been illustrated for the second embodiment and modified example, but the openings may be shaped in any other way, for example, the openings may be circular, character shaped, polygonal, or star shaped. Making the shape of the openings unique enables visibility of the counterbore portions to be improved and arrangement of the probes 2 to be checked readily.

As described above, the present disclosure may include various embodiments not described herein, and various design changes may be made without departing from the technical ideas defined by the claims.

The configurations of the contact probes described herein are just examples, and various types of known probes may be used instead. For example, without being limited to the above described configuration having plungers and a coil spring, probes to be used may each be: a probe including a pipe member; a pogo pin; a solid electrically conductive member; an electrically conductive pipe or wire; or a connecting terminal (a connector) that connects electric contact points together, or any combination of these different types of probes may be combined together as appropriate.

As described above, a probe holder and a probe unit according to the present disclosure are suitable for enabling minimization of increase in loss at high frequency.

All examples and conditional language recited herein are intended for pedagogical purposes of aiding the reader in understanding the disclosure and the concepts contributed by the inventor to further the art, and are not to be construed as limitations to such specifically recited examples and conditions, nor does the organization of such examples in the specification relate to a showing of the superiority and inferiority of the disclosure. Although the embodiments have been described in detail, it should be understood that the various changes, substitutions, and alterations could be made hereto without departing from the spirit and scope of the disclosure.

What is claimed is:

1. A probe holder for holding a contact probe that comes into contact respectively, at both ends of a longitudinal length of the contact probe, with target electrodes, the probe holder comprising:
   a first layered member including a plurality of members layered over one another; and
   a second layered member bonded to the first layered member and including a plurality of members layered over one another, wherein
   each of the first and second layered members includes:
      a first member made of a material having a low dielectric constant;
      a second member provided on one of surfaces of the first member and having higher hardness than the first member; and
      a third member provided on the other surface of the first member and having higher hardness than the first member, and
   the probe holder further comprises a holder hole formed by bonding the third members of the first and second layered members, the holder hole penetrating the probe holder in a direction in which the first and second layered members are layered over each other, and having a stepped hole shape having a smaller diameter in the second members.

2. The probe holder according to claim 1, wherein at least one of the second member and the third member has a counterbore portion that is a through hole formed around the holder hole, the through hole forming a hollow space.

3. The prove holder according to claim 2, wherein the counterbore portion includes:
   a first counterbore portion that is a through hole formed in the second member of the first layered member, the through hole forming a hollow space;

a second counterbore portion that is a through hole formed in the second member of the second layered member, the through hole forming a hollow space; and a third counterbore portion that is a through hole formed in the third members of the first and second layered members, the through hole forming a hollow space.

4. The probe holder according to claim 3, wherein the counterbore portion has a bottom surface at surface of the first member.

5. A probe unit, comprising:

a contact probe that comes into contact respectively, at both ends of a longitudinal length of the contact probe, with target electrodes; and a probe holder including an insulating main body configured to hold the contact probe, wherein the probe holder includes:

a first layered member including a plurality of members layered over one another; and a second layered member bonded to the first layered member and including a plurality of members layered over one another, wherein each of the first and second layered members includes:

a first member made of a material having a low dielectric constant;

a second member provided on one of surfaces of the first member and having higher hardness than the first member; and a third member provided on the other surface of the first member and having higher hardness than the first member, and the probe holder further comprises a holder hole formed by bonding the third members of the first and second layered members, the holder hole penetrating the probe holder in a direction in which the first and second layered members are layered over each other, and having a stepped hole shape having a smaller diameter in the second members.

\* \* \* \* \*